(12) United States Patent
Oita

(10) Patent No.: US 6,762,651 B2
(45) Date of Patent: Jul. 13, 2004

(54) HIGH FREQUENCY CRYSTAL OSCILLATOR AND HIGH FREQUENCY SIGNAL GENERATING METHOD

(75) Inventor: Takeo Oita, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 0 days.

(21) Appl. No.: 10/071,832

(22) Filed: Feb. 7, 2002

(65) Prior Publication Data
US 2002/0109557 A1 Aug. 15, 2002

(30) Foreign Application Priority Data

Feb. 9, 2001 (JP) ......................................... 2001-033084

(51) Int. Cl.⁷ ................................................ H03B 5/32
(52) U.S. Cl. ........................................ 331/158; 331/77
(58) Field of Search ............................ 331/158, 116 R, 331/74, 76, 107 AP, 107 A

(56) References Cited

U.S. PATENT DOCUMENTS

| | | | |
|---|---|---|---|
| 3,974,460 A | 8/1976 | Hongu et al. ............... 332/31 |
| 4,105,949 A | 8/1978 | Hardin ......................... 331/37 |
| 4,325,076 A | 4/1982 | Harwood et al. ............. 358/31 |
| 5,124,980 A * | 6/1992 | Maki ........................... 370/498 |
| 5,128,755 A * | 7/1992 | Fancher ....................... 348/143 |
| 5,162,690 A * | 11/1992 | Ieki et al. ................. 310/313 R |
| 5,712,596 A | 1/1998 | Van Amesfoort ............. 331/76 |
| 6,031,315 A | 2/2000 | Abbott ......................... 310/313 |

FOREIGN PATENT DOCUMENTS

| EP | 785 620 | 7/1997 |
|---|---|---|
| JP | 64-38813 | 3/1989 |

* cited by examiner

Primary Examiner—Timothy P. Callahan
Assistant Examiner—Cassandra Cox
(74) Attorney, Agent, or Firm—Greer, Burns & Crain, Ltd

(57) ABSTRACT

A high frequency oscillator according to the present invention is structured in a small size and prevents noise from taking place in a severe environment of which there is a large temperature change. In the high frequency oscillator according to the present invention, the levels of higher harmonic components are increased against the level of a fundamental wave of an oscillating circuit using a quartz-crystal element. Any component of the higher harmonic components is selected by a surface acoustic wave filter having a piezoelectric substrate that is a crystal substrate. The selected component is amplified and a high frequency oscillation output signal is obtained.

8 Claims, 3 Drawing Sheets

HIGH FREQUENCY CRYSTAL OSCILLATOR AND HIGH FREQUENCY SIGNAL GENERATING METHOD

BACKGROUND OF THE INVENTION

1. Field of the Invention

The present invention relates to a high frequency crystal oscillator using a quartz-crystal element (hereinafter referred to as high frequency oscillator), in particular, to a high frequency oscillator that can be reduced in size and that can prevent noise from taking place.

2. Description of the Related Art

A high frequency oscillator is used for a digital information communication network and so forth. Since the frequency stability is required, a crystal oscillator is used as a high frequency oscillator. In addition, since the output frequency of a high frequency oscillator is a high frequency band of for example 622.08 MHz, the oscillation frequency of the crystal oscillator is multiplied so as to obtain an output frequency. Moreover, to transmit a digital signal, a voltage control type high frequency oscillator is generally used. In recent years, there are needs for reducing the size of such a high frequency oscillator.

As such an example, a high frequency oscillator disclosed as Japanese Patent Application No. 2000-244682 (hereinafter referred to as related reference 1) is known.

FIG. 1 is a schematic diagram showing a circuit of a high frequency oscillator according to the related reference 1.

The high frequency oscillator shown in FIG. 1 comprises a voltage control type crystal oscillator 1, a surface acoustic wave filter (SAW filter) 2, and a wide frequency band amplifier 3. The crystal oscillator 1 has a resonance circuit and an oscillation transistor 5. The resonance circuit is composed of a quartz-crystal element 4, which is an inductor, and split capacitors C1 and C2. The oscillation transistor 5 feedback-amplifies the resonance frequency. The oscillator having such a structure is referred to as Colpits type oscillator.

The oscillation frequency is slightly lower than the resonance frequency of the resonance circuit due to a circuit capacitance other than the split capacitors C1 and C2. In this example, the oscillation frequency is 155.52 MHz that is the fundamental frequency.

The base, the emitter, and the collector of the oscillation transistor 5 are connected to one terminal of the quartz-crystal element 4, the connected point of the split capacitors C1 and C2, and a power supply Vcc, respectively. A voltage variable capacitance device for example a variable capacitance diode 6 is connected between the other terminal of the quartz-crystal element 4 of the resonance circuit and the ground. As a result, the oscillation transistor 5 of voltage control type is accomplished. A control voltage Vc is applied to the quartz-crystal element 4 through a high frequency stopping resistor R1. The control voltage Vc is an inverse voltage against the variable capacitance diode 6. With the control voltage Vc, the oscillation frequency is varied.

In the high frequency oscillator shown in FIG. 1, the resistance ratio of a base resistor R2 and a bias resistor R3 of the oscillation transistor 5 and the resistance ratio of a collector side load resistor R4 and an emitter side load resistor R5 of the oscillation transistor 5 are properly set so that a center voltage $V_0 0$ of an oscillation output signal $V_0$ is higher than a center voltage Vcc0 of the power supply voltage Vcc. In addition, a top portion of the waveform of the oscillation output signal Vo that is normally a sine wave is distorted as shown in FIG. 2. Thus, as shown in FIG. 3, the levels of higher harmonic components (f2 to fn) against the fundamental frequency f1 of the oscillation output signal Vo are increased.

The SAW filter 2 is structured in such a manner that interdigital transducers are formed on a surface of a piezo-electric substrate (not shown). The piezo-electric substrate is composed of lithium tantalate ($LiTaO_3$) that has a large coupling coefficient so as to accomplish a wide frequency band and a low insertion loss. The higher harmonic component f4 (622.08 MHz) that is four times higher than the fundamental signal f1 is selected from the oscillation output voltage Vo by the filter and the SAW filter output it.

The wide frequency band amplifier 3 is a last-staged amplifier composed of a linear IC amplifier of which an output level against an input level becomes linear. In addition, the wide frequency band amplifier 3 causes the waveform of the input signal to be kept and the level of the output frequency to be placed in a predetermined value. Because of the features of a low power consumption and a high amplification factor, a linear IC amplifier is used for a last-staged amplifier. In the example shown in FIG. 1, the power supply voltage Vcc is 3.3 V. In FIG. 3, reference symbol C3 represents a coupling capacitance. As long as a particular higher harmonic component can be amplified, it is not necessary to always use a wide frequency band amplifier.

As another example, a high frequency oscillator disclosed as Japanese Patent Application No. HEI 11-329318 (hereinafter referred to as related reference 2) is known.

In the related reference 2, instead of distorting an output waveform of a crystal oscillator, an oscillation output is amplified using a saturation region of a wide frequency band amplifier so that the levels of the higher harmonic components (f2 to fn) become almost the same as the level of the fundamental frequency f1. As with the related reference 1, a higher harmonic component whose frequency is four times higher than the frequency of the fundamental frequency f1 is selected by a SAW filter and the selected higher harmonic component is amplified.

Since the high frequency oscillators according to the related references 1 and 2 can be basically composed of three devices of a voltage control type crystal oscillator 1, a SAW filter 2, and a wide frequency band amplifier 3 or four devices including thereof. Thus, the number of structural devices of these high frequency oscillators can be decreased. Thus, according to each of the related references, the size of the high frequency oscillator can be remarkably reduced in comparison with a so-called high frequency multiplying amplifier of which an oscillation frequency (fundamental frequency) of for example a crystal oscillator is amplified by a plurality of stages of multiplying amplifiers each of which is an LC resonance circuit. For example, the volume of the high frequency oscillator according to the related reference 1 is smaller than ⅛ times the volume of the above-mentioned high frequency multiplying oscillator.

However, the high frequency oscillators according to the related references have the following problem due to the presence of the SAW filter 2.

As was described above, the piezo-electric substrate that composes the SAW filter 2 is mode of lithium tantalate that has a large coupling coefficient. However, since lithium tantalate has a property of ferroelectricity, it has a pyroelectricity effect. The pyroelectricity effect is a phenomenon of which a large temperature change causes a potential to take place at two points of a crystal and the potential causes an electric discharge to take place. With this phenomenon, pulses of the electric discharge are detected on the output side of the SAW filter.

The pulses that take place caused by this phenomenon on the output side of the SAW filter 2 are amplified by the wide frequency band amplifier 3. Thus, the pulses cause noise to take place in the output frequency signal of the high frequency oscillator. This situation results in a critical problem of a communication unit that is used outdoors in a severe environment of there is a large temperature change.

A technology for preventing an electric discharge and pulses due to the pyroelectricity effect to take place has been proposed and used (for example, as Japanese Patent Examined Publication No. SHO 63-67363). According to such a technology, a resistor film made of chromium (Cr) or the like is deposited on the front surface of the SAW filter and grounded so that pulses due to an electric discharge by the pyroelectricity effect are prevented from taking place. However, in reality, it is difficult to accomplish a thin film of chromium (Cr) having a high resistance. Thus, such a technology cannot sufficiently solve the above-described problem.

SUMMARY OF THE INVENTION

An object of the present invention is to provide a high frequency oscillator that prevents noise from taking place. Another object of the present invention is to provide a high frequency oscillator that allows the number of structural devices to be decreased and thereby the size the final unit to be reduced.

The present invention is based on a high frequency crystal oscillator for increasing the levels of higher harmonic components against the level of a fundamental frequency of a oscillating circuit using a quartz-crystal element, selecting any higher harmonic component by a surface acoustic wave filter, amplifying the selected higher harmonic component, and obtaining a high frequency oscillation output signal, wherein a piezo-electric substrate that composes the surface acoustic wave filter is a crystal substrate.

A first aspect of the high frequency crystal oscillator according to the present invention comprises a crystal oscillating unit for causing the center voltage of an oscillation output signal to be higher than the center voltage of a power supply voltage so as to distort an output signal and output the output signal, and a surface acoustic wave filter for extracting a particular frequency component of the output signal of the crystal oscillator unit, a piezo-electric substrate of the crystal oscillator unit being a crystal substrate.

A second aspect of the high frequency crystal oscillator according to the present invention comprises an oscillating unit using a quartz-crystal element, an amplifying unit for amplifying higher harmonic components of an output signal of the oscillating unit, and a surface acoustic wave filter for selectively outputting a particular frequency higher harmonic component of an output signal amplified by the amplifying unit, a piezo-electric substrate of the surface acoustic wave filter being a crystal substrate.

According to the present invention, since pulses due to the pyroelectricity effect that takes place in a surface acoustic wave filter are suppressed, the high frequency oscillator can be used in a severe environment of which there is a large temperature change.

In addition, the size of the high frequency oscillator according to the present invention can be reduced in comparison with a conventional high frequency oscillator.

These and other objects, features and advantages of the present invention will become more apparent in light of the following detailed description of a best mode embodiment thereof, as illustrated in the accompanying drawings.

DESCRIPTION OF PREFERRED EMBODIMENTS

According to the present invention, since a piezo-electric substrate that composes a SAW filter is a crystal substrate, noise due to a large temperature change can be prevented. In other words, since the SAW filter is composed of the crystal substrate, the influence of the pyroelectricity effect is suppressed. Thus, occurrences of an electric discharge and pulses due to a large temperature change can be prevented.

In addition, when the present invention is applied to the technology of the related reference 1 or 2 of which the levels of higher harmonic components is increased, any higher harmonic component is selected by a SAW filter, and the selected higher harmonic component is amplified. As a result, a high frequency oscillator whose size is remarkably reduced can be accomplished. In this case, the levels of higher harmonic components of an oscillation frequency (fundamental frequency) are increased. A particular frequency component is selected from those components by a SAW filter. The level of the selected component is amplified. Thus, a plurality of stages of multiplying amplifiers are not required. In addition, since the SAW filter is composed of a crystal substrate, an electric discharge of the pyroelectricity effect due to a temperature change is suppressed. Thus, in a severe environment of which there is a large temperature change such as outdoor, noise that takes place in a high frequency output signal can be suppressed.

Next, as an embodiment of the present invention, an example of which the present invention is applied to the structure of the related reference 1 will be described.

Figure 1:
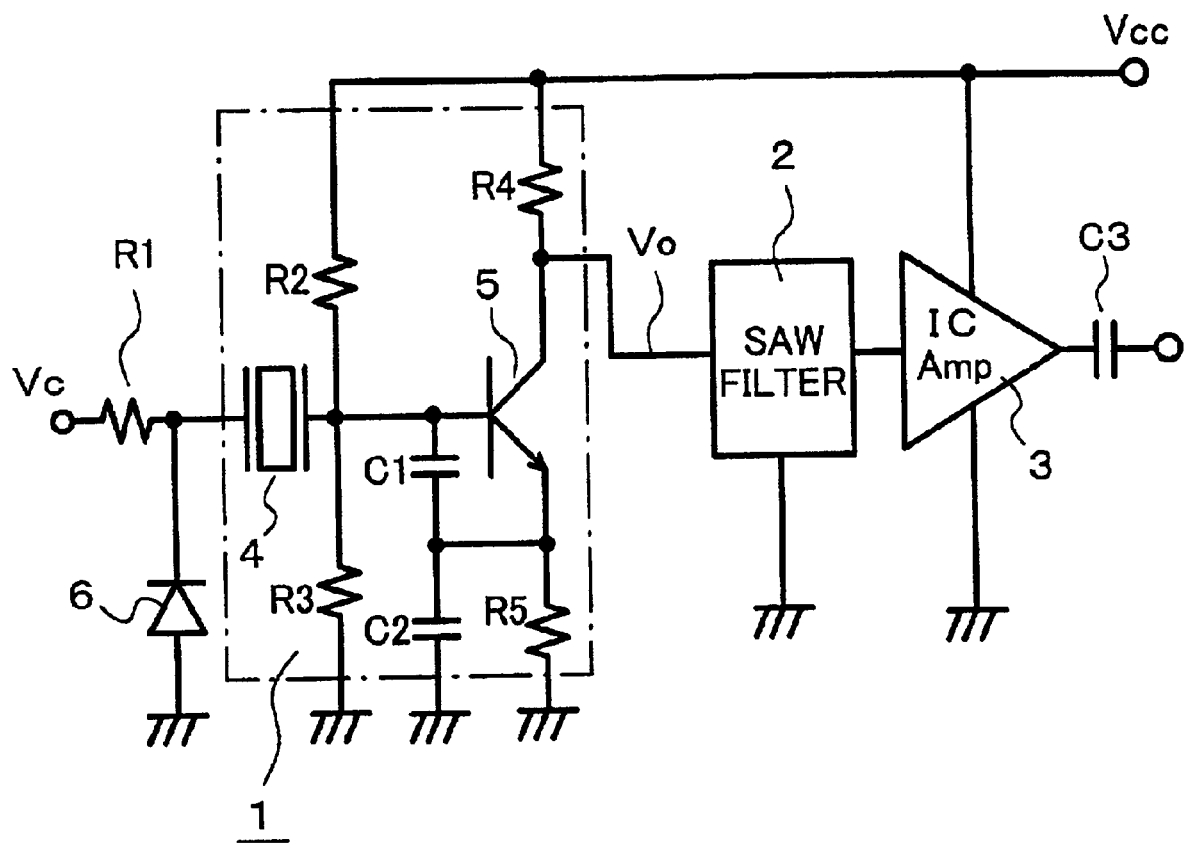
FIG. 1 is a schematic diagram showing a circuit of a high frequency oscillator according to the related reference 1.
Figure 2:
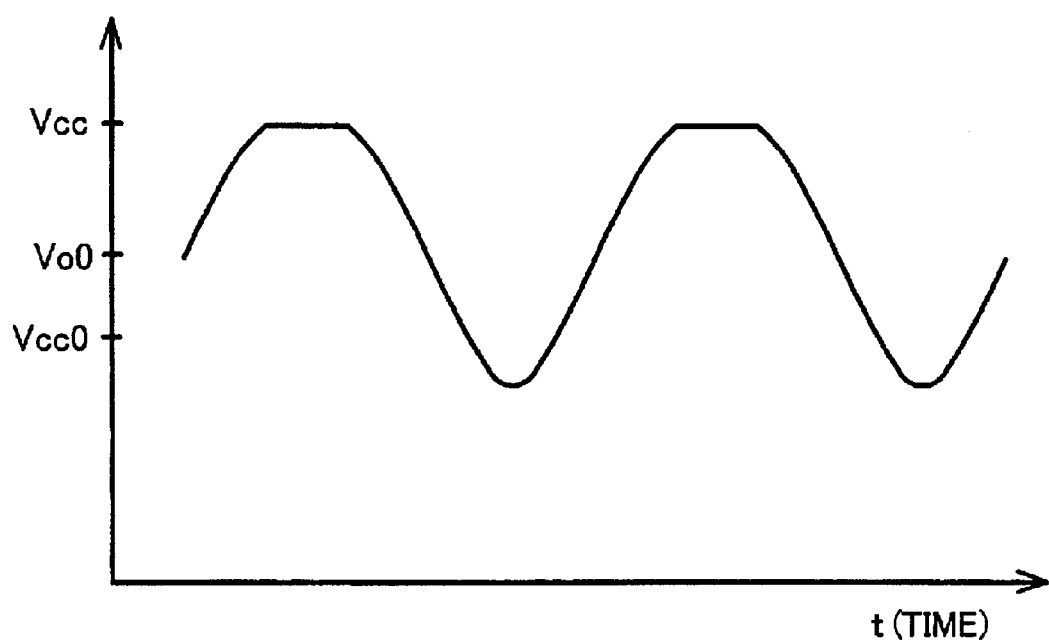
FIG. 2 is a schematic diagram showing an output waveform of a crystal oscillator.
Figure 3:
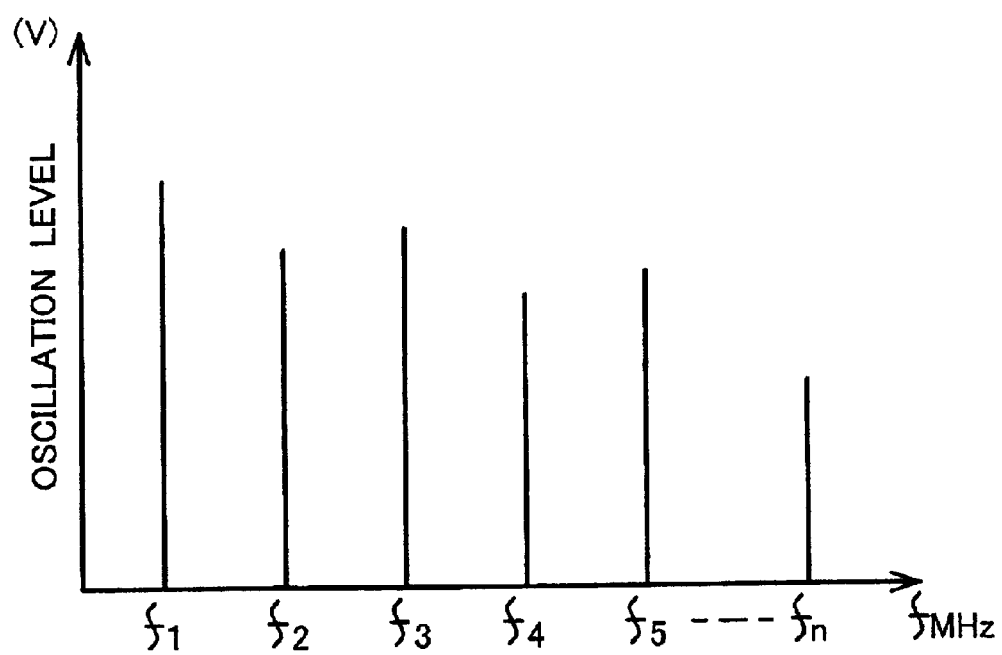
FIG. 3 is a schematic diagram showing a frequency spectrum of an output waveform.

With reference to FIGS. 1 to 3, the embodiment will be described. In a high frequency oscillator according to the embodiment, description of similar portions to those that have been described will be simplified or omitted.

As with the above-described related reference 1, the high frequency oscillator according to the embodiment comprises a Colpitts type crystal oscillator 1, a SAW filter 2, and a wide frequency band amplifier 3. In the crystal oscillator 1, a voltage control type resonance circuit is composed of a quartz-crystal element 4 and split capacitors C1 and C2. The output waveform is distorted so as to increase the levels of higher harmonic components f (f2 to fn). The SAW filter 2 selects a higher harmonic component f4 (622.08 MHz) that is four times higher than the frequency of the fundamental frequency f1 (155.52 MHz) and outputs the selected component. The wide frequency band amplifier 3 amplifies the four time higher frequency higher harmonic component f4.

In addition, according to the embodiment, a piezo-electric substrate that composes the SAW filter 2 is a crystal substrate instead of a substrate made of lithium tantalate. For example, the crystal substrate is ST-cut. On the crystal substrate, transversal type input and output interdigital transducers (IDT) (not shown) are formed. The IDT electrodes are structured in such a manner that electrode fingers extrude from a pair of common electrodes and intersect with each other. As was described above, the four times higher frequency harmonic component is selected from an oscillation output signal of the crystal oscillator through the input IDT electrodes.

Next, an embodiment of which the present invention is applied to the structure of the related reference 2 will be described.

Figure 4:
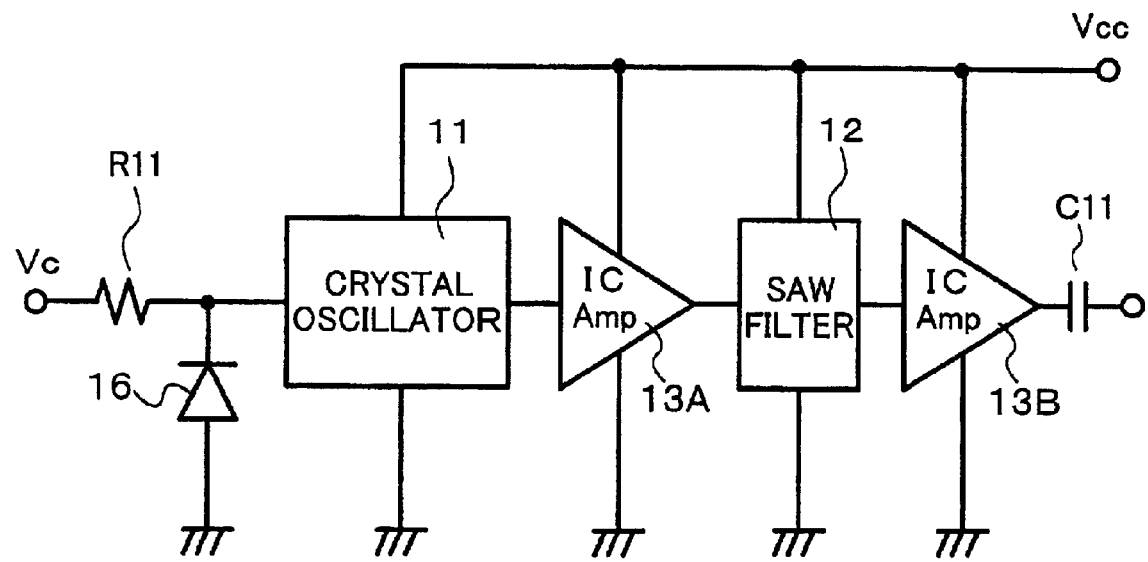
FIG. 4 is a schematic diagram showing a circuit of a high frequency oscillator according to the related reference 2.

FIG. 4 is a schematic diagram showing a circuit of a high frequency oscillator according to the embodiment.

The high frequency oscillator according to the embodiment shown in FIG. 4 comprises a crystal oscillator 11, a wide frequency band amplifier 13A, a SAW filter 12, and a wide frequency band filter 13B.

Figure 5:
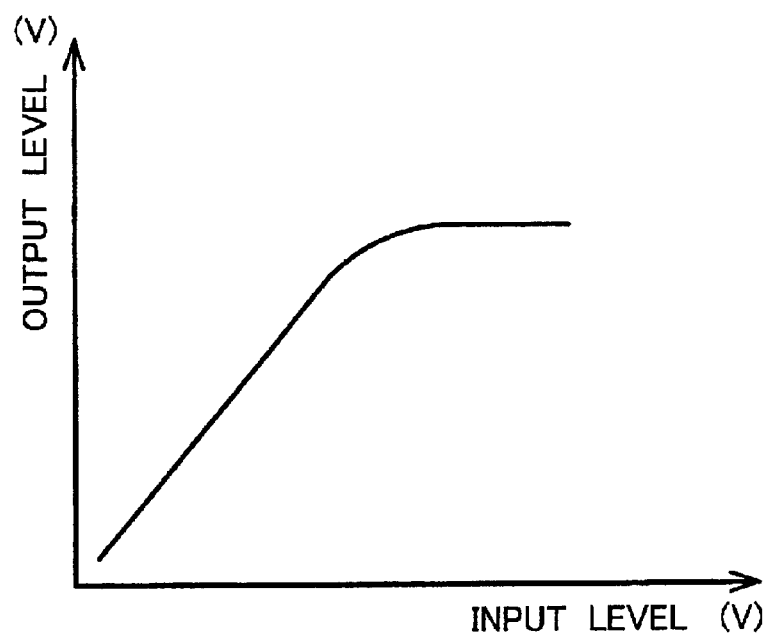
FIG. 5 is a schematic diagram showing input and output characteristics of a wide frequency band amplifier.

The crystal oscillator 11 is a Colpitts type oscillating circuit using a quartz-crystal element. The crystal oscillator 11 varies the capacitance of a variable capacitance diode 16 with a control voltage Vc that is input through a high frequency stopping resistor R11 so as to vary the oscillation frequency. The wide frequency band amplifiers 13A and 13B are linear IC amplifiers that amplify signals of frequencies ranging from for example 100 MHz to 2000 MHz. As shown in FIG. 5, the wide band amplifiers 13A and 13B linearly amplify the level of an input signal up to a predetermined value. When the input level exceeds the predetermined value, the output level is saturated.

As with the structure of the related reference 1, the SAW filter 12 according to this embodiment is composed of a crystal substrate as a piezo-electric substrate. For example, the crystal substrate is ST-cut. Input and output IDT electrodes of for example transversal type are formed on the crystal substrate.

Integer times higher frequency harmonic components f2, f3, . . . , fn than an oscillation frequency (fundamental frequency) f1 are contained in an output signal of the crystal oscillator 11 are amplified by the wide frequency band amplifier 13A along with the fundamental frequency f1. At that point, they are amplified using a saturation region of the wide frequency band amplifier 13A. Thus, the levels of the higher harmonic components f2, f3, . . . , fn are amplified up to approximately the same level as the level of the fundamental frequency f1.

An output signal of the wide frequency band amplifier 13A is input to the SAW filter 12. The SAW filter 12 selects a particular frequency component for example the four times higher frequency component f4 than the fundamental frequency f1 and outputs the selected frequency component f4. Finally, the frequency component f4 that is output from the SAW filter 12 is amplified by the wide frequency band filter 13B. At that point, the frequency component f4 is amplified using a linear region of input and output characteristics of the wide frequency band filter 13B shown in FIG. 5.

The SAW filters 2 and 12 may be of resonance type using for example symmetrical mode or inclined symmetrical mode rather than transversal type.

Since a crystal substrate as a piezo-electric substrate is not ferroelectric, it does not basically have the pyroelectricity effect. Thus, even if there is a large temperature change, no potential takes place on the crystal substrate. As a result, neither an electric discharge takes place, nor pulses due to the electric discharge are detected. Thus, noise due to the pyroelectricity effect does not take place in the high frequency output signal of the high frequency oscillator according to the embodiment. In addition, since the number of structural devices can be decreased, the size of the high frequency oscillator can be reduced.

In the high frequency crystal oscillators according to the present invention, because the output signal of the oscillating circuit is distorted, etc., and the levels of the higher harmonic components are increased. Any higher harmonic component is selected by the SAW filter. The selected higher harmonic component is amplified and an amplified high frequency oscillation output signal is obtained. In addition, since a crystal substrate is used as a piezo-electric substrate that composes the SAW filter, noise can be prevented from taking place in the high frequency output signal. In addition, since the number of structural devices is decreased, the size of the high frequency crystal oscillator can be reduced.

It should be noted that the present invention can be applied to any high frequency oscillator as long as a particular frequency component is selected and output using a SAW filter as well as the structures of the related references 1 and 2.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A high frequency crystal oscillator increasing levels of higher harmonic components against a level of a fundamental frequency of a generating circuit using a quartz-crystal element, selecting any higher harmonic component by a surface acoustic wave filter, amplifying the selected higher harmonic component, and obtaining a high frequency oscillation output signal, wherein a piezo-electric substrate that composes the surface acoustic wave filter is a crystal substrate.

2. A high frequency crystal oscillator, comprising:

a crystal oscillating unit causing a center voltage of an oscillation output signal to be higher than the center voltage of a power supply voltage so as to distort an output signal and output the output signal; and a surface acoustic wave filter extracting a particular frequency component of the output signal of the crystal oscillating unit, a piezo-electric substrate of the surface acoustic wave filter being a crystal substrate.

3. A high frequency crystal oscillator, comprising:

an oscillating unit using a quartz-crystal element;

an amplifying unit amplifying higher harmonic components of an output signal of the oscillating unit; and a surface acoustic wave filter selectively outputting a particular frequency higher harmonic component of an output signal amplified by the amplifying unit, a piezo-electric substrate of the surface acoustic wave filter being a crystal substrate.

4. The high frequency crystal oscillator as set forth in claim 3, wherein the amplifying unit amplifies the higher harmonic component of the output signal using a saturation region of input and output characteristics thereof.

5. A high frequency crystal oscillator, comprising:

crystal oscillating means for causing a center voltage of an oscillation output signal to be higher than the center voltage of a power supply voltage so as to distort an output signal and output the output signal; and surface acoustic wave filter means for extracting a particular frequency component of the output signal of the crystal oscillating means, a piezo-electric substrate of the surface acoustic wave filter means being a crystal substrate.

6. A high frequency crystal oscillator, comprising:

oscillating means for using a quartz-crystal element;

amplifying means for amplifying higher harmonic components of an output signal of the oscillating means; and surface acoustic wave filter means for selectively outputting a particular frequency higher harmonic component of an output signal amplified by the amplifying means, a piezo-electric substrate of the surface acoustic wave filter being a crystal substrate.

7. A high frequency signal oscillating method, comprising:

distorting an output signal of an oscillating circuit using a crystal oscillator and outputting the output signal; and extracting a particular frequency component from the output signal by supplying the output signal to a surface acoustic wave filter having a piezo-electric substrate that is a crystal substrate.

8. A high frequency signal oscillating method, comprising the steps of:

amplifying higher harmonic components of an output signal of an oscillating unit using a quartz-crystal element; and extracting a particular frequency component from the output signal by supplying the amplified output signal to a surface acoustic wave filter having a piezo-electric substrate that is a crystal substrate.

* * * * *